(12) United States Patent
Battaglia

(10) Patent No.: US 7,216,212 B2
(45) Date of Patent: May 8, 2007

(54) SEMICONDUCTOR MEMORY WITH SELF-REFRESH CAPABILITY

(75) Inventor: Francesco Battaglia, Messina (IT)

(73) Assignee: STMicroelectronics, S.R.L. (IT)

( * ) Notice: Subject to any disclaimer, the term of this patent is extended or adjusted under 35 U.S.C. 154(b) by 342 days.

(21) Appl. No.: 10/387,141

(22) Filed: Mar. 11, 2003

(65) Prior Publication Data

US 2003/0227801 A1   Dec. 11, 2003

(30) Foreign Application Priority Data

Mar. 11, 2002   (EP)   ................................. 02425138

(51) Int. Cl.
*G06F 12/00*   (2006.01)
(52) U.S. Cl. ............................ 711/167; 711/106; 711/5
(58) Field of Classification Search ..................... 711/5, 711/136, 145, 147, 148, 202, 207, 122, 113, 711/154, 167
See application file for complete search history.

(56) References Cited

U.S. PATENT DOCUMENTS

| | | | |
|---|---|---|---|
| 4,747,070 A | | 5/1988 | Trottier et al. |
| 5,226,009 A | | 7/1993 | Arimoto |
| 5,249,282 A | * | 9/1993 | Segers .......................... 711/122 |
| 5,727,180 A | | 3/1998 | Davis et al. |
| 5,999,474 A | * | 12/1999 | Leung et al. ................ 365/222 |
| 6,269,382 B1 | * | 7/2001 | Cabrera et al. .............. 711/113 |
| 6,598,077 B2 | * | 7/2003 | Primak et al. ............... 709/219 |
| 6,751,157 B2 | * | 6/2004 | Leung .......................... 365/233 |
| 2002/0186492 A1 | * | 12/2002 | Smith ............................ 360/69 |
| 2003/0074525 A1 | * | 4/2003 | Yamauchi et al. ........... 711/113 |
| 2005/0235119 A1 | * | 10/2005 | Sechrest et al. ............. 711/158 |

FOREIGN PATENT DOCUMENTS

EP    0 811 979 A2    12/1997

OTHER PUBLICATIONS

European Search Report for EP 02 42 5138 dated Nov. 5, 2002.

* cited by examiner

*Primary Examiner*—Pierre-Michel Bataille
(74) *Attorney, Agent, or Firm*—Lisa K. Jorgenson; Bryan A. Santarelli; Graybeal Jackson Haley LLP

(57) ABSTRACT

A memory device comprises a plurality of banks of storage locations accessible in response to access requests. Data refresh means are provided for refreshing data stored in the storage locations within prescribed times, whereby the memory device autonomously perform a refresh. A cache memory is embedded in the memory device. The cache memory has a plurality of cache storage locations for storing data contained in recently accessed storage locations. Access control means control the access to the storage locations and to the cache storage locations in response to the access requests: an access request is diverted to the cache memory whenever access to anyone of the recently accessed storage locations is requested. Any cache storage location is freely associable to any storage location in any bank, the association between any cache storage location and a storage location in the plurality of banks being established by a storage location association table in the access control means.

11 Claims, 6 Drawing Sheets

SEMICONDUCTOR MEMORY WITH SELF-REFRESH CAPABILITY

PRIORITY CLAIM

This application claims priority from European patent application No. 02425138.1, filed Mar. 11, 2002, which is incorporated herein by reference.

TECHNICAL FIELD

The present invention relates generally to the field of semiconductor memories, especially dynamic random access memories (DRAMs) and static random access memories (SRAMs). In particular, the present invention relates to a semiconductor memory capable of autonomously handling refresh operations in a way completely transparent to external devices, so that the refresh operations do not interfere with external access requests.

BACKGROUND

DRAMs are widely used for temporary storage of large amounts of data, thanks to the simplicity and compactness of the memory cells. A DRAM memory cell consists in fact of a selection transistor and a charge-storage capacitor, in which the information is stored in form of an electric charge. The selection transistor allows accessing the storage capacitor for either writing the information therein or reading the stored information.

Compared to SRAMs, which have memory cells formed by four or even six transistors, DRAMs occupies substantially less semiconductor area and are therefore cheaper devices.

A problem of DRAMs, not encountered in SRAMs, is the need of periodically refreshing the information stored in the memory cells. Unavoidable leakages in the storage capacitors cause a decrease in time of the charge stored therein and, eventually, the loss of the information.

Refreshing the information involves reading the information stored in each memory cell and then rewriting the same information, thereby restoring the prescribed electric charge in the storage capacitors. The external device, for example the microprocessor controlling the DRAM needs to access twice every single memory location, firstly for reading the data stored therein and then for rewriting the read data. This operation increases significantly the workload of the microprocessor.

DRAMs have been proposed capable of autonomously carrying out the refresh of the memory cells, thus relieving the microprocessor of this burden.

One such DRAM is disclosed in U.S. Pat. No. 5,999,474. The memory comprises several banks of DRAM cells and a control circuit for accessing and refreshing the DRAM cells. The DRAM banks can operate-independently of each other, so that parallel operations such as read, write and refresh can take place in different DRAM banks simultaneously. An SRAM cache is incorporated in the DRAM, for storing the recently accessed data. When access is requested to the recently accessed data present in the SRAM cache, the latter is accessed instead of the DRAM banks, so that the refresh operation can go on in the DRAM banks.

The SRAM cache has the same storage capacity and organization as a DRAM bank, and is configured as a direct map cache: a one-to-one positioning correspondence exists between the SRAM cache locations and the memory locations in the DRAM banks.

A limitation of the direct-mapping scheme is that two steps are necessary to access a memory location: in a first step a cache tag is accessed, to determine the DRAM bank associated with the accessed SRAM cache location; in a second step the bank number retrieved from the cache tag is compared to the bank number included in the access address, to ascertain whether the content of the accessed memory location is already present in the SRAM cache or not. This two-step access process increases the memory access time.

Another limitation of the cache direct-mapping scheme is that the cache memory must have at least the same storage capacity as a DRAM bank (same number of memory locations). This has a significant impact in terms of semiconductor chip area. The SRAM cache occupies an area at least approximately four times the area of a DRAM bank: the area occupied by the SRAM cache can be comparable with the overall area occupied by the DRAM banks.

An additional limitation of the cache memory being configured as a direct-map cache, involving a highly inflexible allocation scheme based on a rigid positioning correspondence between the DRAM locations and the cache locations, is the high number of cache misses, especially when sequences of adjacent DRAM locations need to be accessed.

A further limitation of the cache direct-mapping scheme is the inefficient exploitation of the SRAM cache storage capacity. Already allocated cache locations need to be replaced even if the cache is still partially empty. This increases the power consumption of the memory device, especially when a write-back from the SRAM cache into the DRAM banks takes place.

SUMMARY

In view of the state of the art outlined, an embodiment of the present invention solves the above-discussed problems.

Briefly stated, a memory device according to an embodiment of the invention comprises a plurality of banks of storage locations accessible in response to access requests to the memory device.

Data refresh means are provided for refreshing data stored in the storage locations within prescribed times;

A cache memory having a plurality of cache storage locations is provided, for storing the data content of recently accessed storage locations.

Access control means control the access to the storage locations and to the cache storage locations in response to the access requests. If access to anyone of the recently accessed storage locations is requested, the access control means divert the access request to the cache memory.

Any cache storage location is freely associable to any storage location in any bank. The association between any cache storage location and a storage location in the plurality of banks is established by a storage location association table provided in the access control means.

The free associability of the cache storage locations to any storage location in any bank greatly improves the exploitation efficiency of the cache memory.

BRIEF DESCRIPTION OF THE DRAWINGS

The features and advantages of the present invention will be made apparent by the following detailed description of some embodiments thereof, provided merely by way of non-limitative example, made in connection with the annexed drawings, wherein.

DETAILED DESCRIPTION

Figure 1:
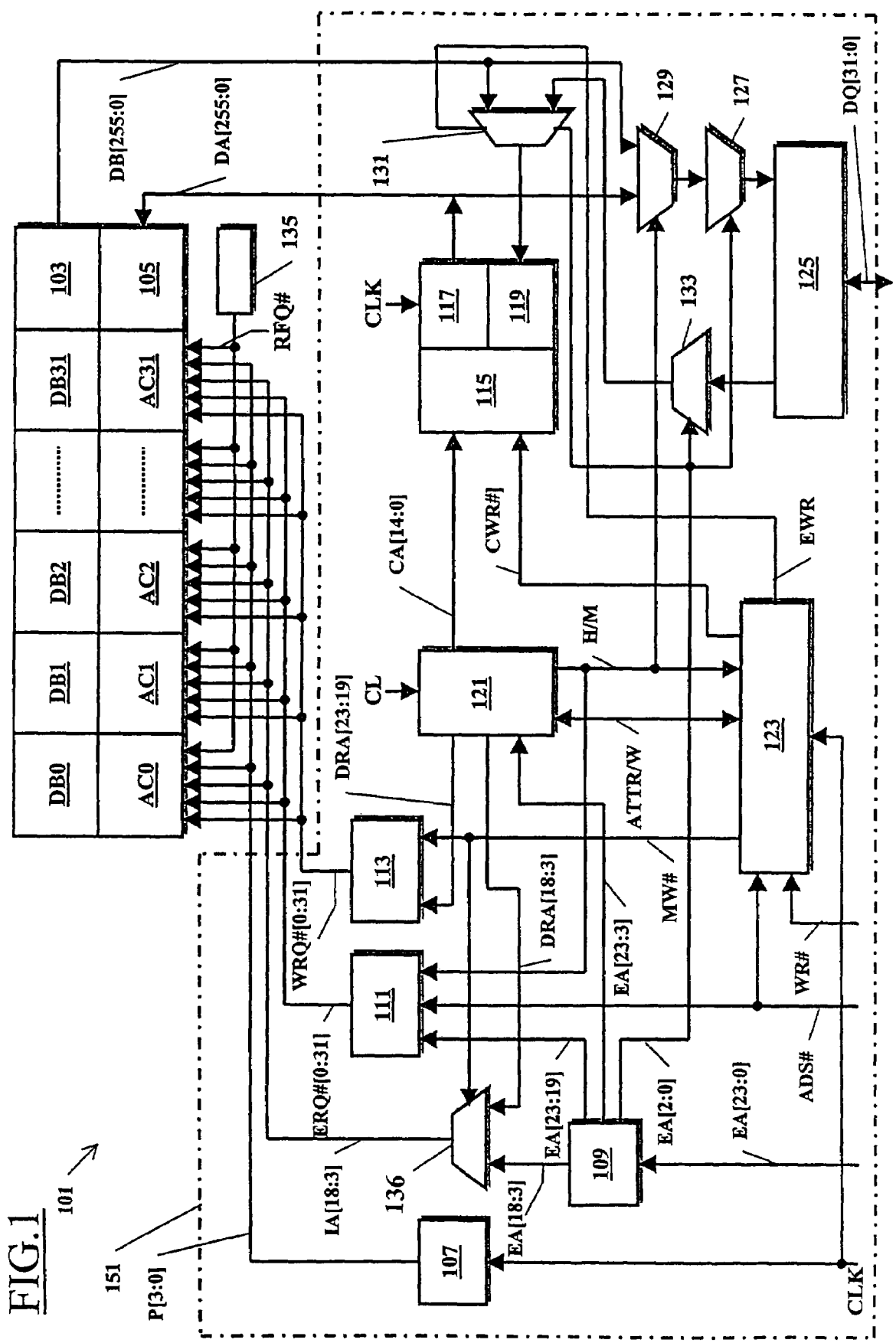
FIG. 1 is a block diagram of a memory according to an embodiment of the present invention.

With reference to the drawings, FIG. 1 is a block diagram of a memory 101 in accordance with an embodiment of the present invention. The memory of the embodiment described herein has a capacity of 16M memory words (memory external words), each word having a length of 32-bits (4 bytes). The memory 101 includes thirty-two DRAM banks DB0–DB31, and, correspondingly, thirty-two access control circuits AC0–AC31, independent from each other for allowing multi-bank parallel operations.

As described in more detail below, the access control circuits AC0–AC31 are coupled to receive address and control signals required to access the DRAM banks DB0–DB31. Each of the DRAM banks DB0–DB31 includes an array of DRAM cells, particularly small-size, one-transistor DRAM cells. Each array of DRAM cells includes 64 rows; every row is made up of 1024 row sections of 256 columns of DRAM cells, thereby each DRAM bank DB0–DB31 includes a total of 16,777,216 DRAM cells. Each row section forms a memory internal word, containing eight memory external words.

The thirty-two DRAM banks DB0–DB31 share a common read buffer/data latch circuit 103 and a common write buffer/data latch circuit 105. As described in more detail below, read and write data are transferred to and from the DRAM banks DB0–DB31 through the read and write buffer/data latch circuits 103 and 105. Each of the DRAM banks is coupled in parallel to the read buffer 103, so that data read from any one of the DRAM banks is provided to the read buffer 103. Each of the DRAM banks is further coupled in parallel to the write buffer 105, so that data written to any of the memory banks is provided from the write buffer 105.

The read buffer/data latch circuit 103 and the write buffer/data latch circuit 105 operate independently of each other, thereby allowing data to be read from one of the DRAM banks DB0–DB31 at the same time that data is being written into another one of the DRAM banks DB0–DB31. To this purpose, separate read bus DB[255:0] and write bus DA[255:0] are employed.

A refresh timer 135 is provided within the memory 101, for managing a periodical refresh of the DRAM memory cells in the DRAM banks DB0–DB31. The refresh timer 135 periodically broadcasts refresh access requests (by a refresh request signal RFQ#) simultaneously to all the DRAM banks DB0–DB31. An alternative embodiment of the invention may provide that the refresh request is only broadcast to a subset of the DRAM banks DB0–DB31 at a given time. The DRAM banks that receive the refresh request signal RFQ# go through a refresh cycle only when there is no read or write bank access pending. The refresh routine in each DRAM bank DB0–DB31 is governed by the respective access control circuit AC0–AC31, as will be explained in greater detail later on.

The thirty-two DRAM banks DB0–DB31 operate independently of each other, so that parallel operations, such as read, write and refresh, can take place in different DRAM banks simultaneously.

The memory 101 includes a control circuit, globally identified by 151, that controls the accesses to the DRAM banks DB0–DB31. The basic elements of the control circuit 151 are described below.

A cache memory 115 made up of SRAM cells (e.g., six- or eight-transistor SRAM cells) is embedded in the memory 101 to store the content of the most recently accessed memory locations. The SRAM cache 115 has a significantly smaller storage capacity than that of the DRAM banks overall considered. In particular, the SRAM cache 115 has a storage capacity substantially smaller than that of one DRAM bank. In the exemplary embodiment described herein the SRAM cache 115 has a storage capacity equal to half the storage capacity of one of the DRAM banks DB0–DB31; this simplifies the design of the memory 101. However, the SRAM cache may have a different storage capacity. The choice of the SRAM cache storage capacity is made trading off the desire of keeping the semiconductor area overhead limited and the need of ensuring that all refresh accesses of the DRAM banks are properly performed within a predetermined refresh period, even under the worst case cache thrashing conditions.

A cache read buffer 117 and a cache write buffer 119 are associated with the SRAM cache 115. Access to the SRAM cache is controlled by an address transcode table 121 and a cache control sequencer 123.

The control circuit 151 further includes a clock phase generator 107, an address buffer 109, bank address decoders 111 and 113, an I/O driver 125, multiplexers 127, 129, 131 and 136 and a de-multiplexer 133.

The memory 101 operates in response to the following signals: input/output (I/O) data signals DQ[31:0], external address signals EA[23:0], an address strobe signal ADS#, a write/read indicator signal WR# and a clock signal CLK for synchronizing the memory transactions between the memory 101 and the outside world. In the context of the present specification, the # symbol appended to a signal name indicates that such a signal is active (asserted) when in the low logic state.

It can be appreciated that no signals relating to the refresh accesses to DRAM banks DB0–DB31 are provided to the memory 101 by the outside world, since the memory has a self-refresh capability. In this sense, the memory 101, albeit made up of DRAM cells, is externally equivalent to an SRAM.

An external device, e.g. a microprocessor (not shown in the drawings) initiates an access to the memory 101 by asserting the address strobe signal ADS#, driving the write/read indicator signal WR# to the desired state (low logic state for a read access, high logic state for a write access), and providing a twenty-four-bit memory address on the external address signals EA[23:0]. The address strobe signal ADS# is supplied to the bank address decoder 111 and to the cache control sequencer 123.

The memory 101 recognizes the access request at the rising edge of the clock signal CLK, occurring after the assertion of the address strobe signal ADS#. The write/read indicator signal WR# is supplied to the cache control sequencer 123, which thus recognizes the type of access request: read access request or write access request.

The external address signals EA[23:0] are supplied to the address buffer 109. Inside the memory 101, the twenty-four external address bits EA[23:0] are divided into four fields. Five external address bits EA[23:19] form a bank address field that identifies one of the thirty-two DRAM banks DB0–DB31. Six external address bits EA[18:13] form a row address field that identifies one of the sixty-four rows in the addressed DRAM bank. Ten external address bits EA[12:3] form a column address field that identifies one of the 1024 sections of 256 bits (i.e., one of the 1024 memory internal words) within the addressed row. Finally, three external address bits EA[2:0] form a byte address field that identifies one of the eight 32-bit external words within the addressed 256-bit section (i.e., within the addressed internal word).

Read or write data DQ[31:0] are provided at the I/O driver 125 during the clock cycle after the access request is recognized. The read data are provided to the I/O driver 125 by the memory 101, and the read data are made available to the external world on the input/output data signals DQ[31:0]. Write data are provided to the I/O driver 125 by the external world, through the input/output data signals DQ[31:0].

The read buffer 103 and the write buffer 105 include transparent latches that latch read and write data during DRAM read and write operations, respectively. Both the read buffer 103 and the write buffer 105 include 256 latches, thereby these buffers are capable of storing one 256-bit section of an addressed row (i.e., one internal word).

Figure 2:
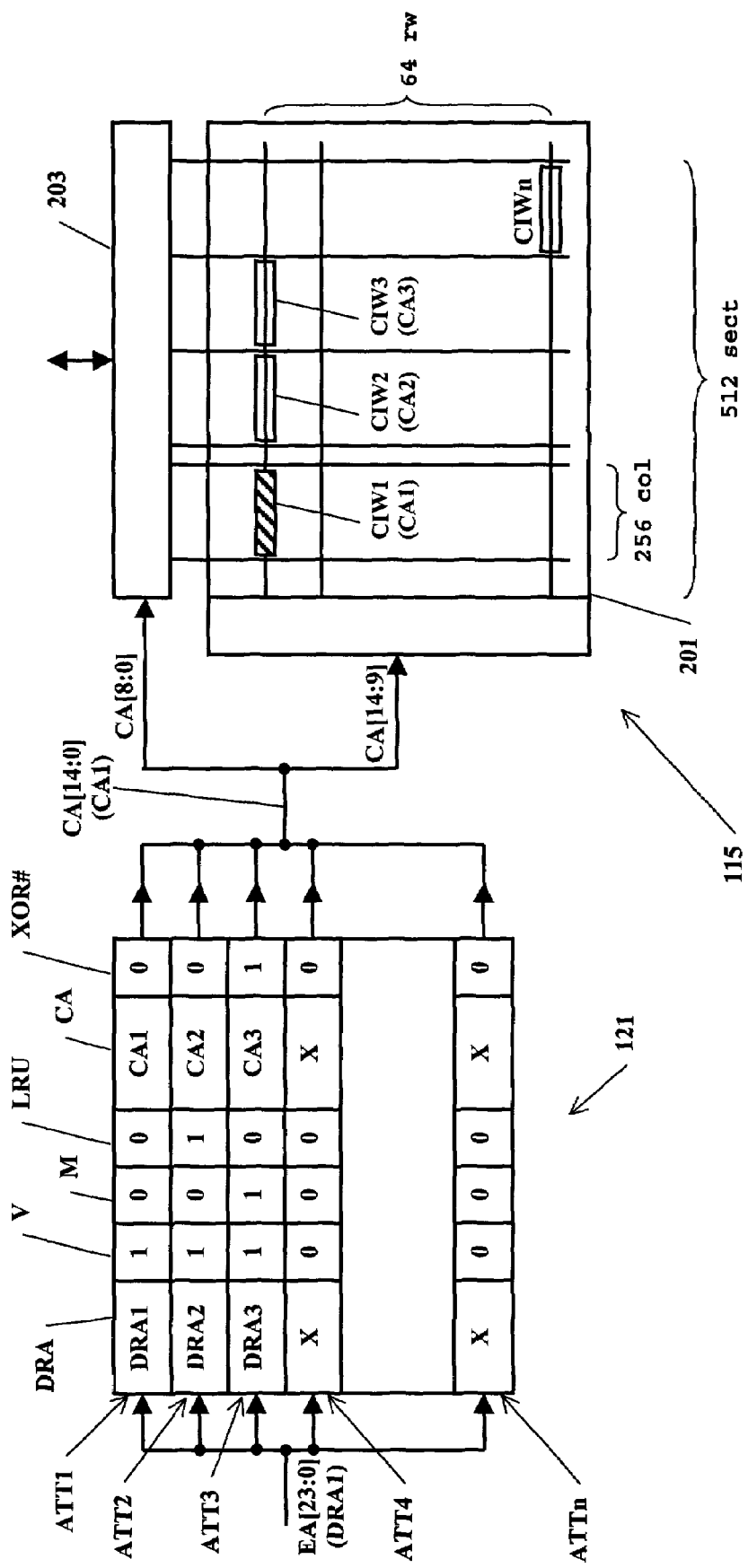
FIG. 2 schematically shows an SRAM cache memory and an associated address transcode table embedded in the memory of FIG. 1, in an embodiment of the present invention.

FIG. 2 schematically shows in greater detail the organization of the SRAM cache 115 and the associated address transcode table 121, according to one embodiment of the present invention. The SRAM cache 115, which in the exemplary embodiment herein described has a storage capacity equal to half that of a DRAM bank DB0–DB31, includes an array of SRAM memory cells made up of sixty-four rows; each row includes five hundred and twelve 256-bit sections (cache internal words CIW1–CIWn). In this embodiment, the SRAM cache includes therefore 32,768 cache internal words CIW1–CIWn (n=32,768), each having the same size as an internal word of the DRAM banks.

The SRAM cache 115 receives cache address signals CA[14:0] from the address transcode table 121. Cache address bits CA[114:9] form a cache row address field, identifying one of the sixty-four SRAM cache rows; cache address bits CA [8:0] form a cache column address field, identifying one of the five hundred and twelve 256-bit sections (cache internal words CIW1–CIWn) within the addressed cache row. Row and column decoder and selection circuits 201 and 203 carry out the selection of the SRAM cache rows and columns, respectively.

The address transcode table 121 includes as many entries ATT1–ATTn as the number of cache internal words CIW1–CIWn; in the exemplary embodiment herein described the number of entries ATT1–ATTn of the address transcode table 121 is thus equal to 32,768. Each entry ATT1–ATTn of the address transcode table is in one-to-one correspondence with a cache internal word CIW1–CIWn.

In the herein described embodiment of the invention, each address transcode table entry ATT1–ATTn is made up of the following fields: a 21-bit field DRA (DRAM address field) for storing the external address bits EA[23:3] identifying an internal word in the thirty-two DRAM banks DB0–DB31; a one-bit field V (valid entry field) used as a flag to signal the consistency of the data contained in the associated cache internal word CIW1–CIWn with the data stored in the DRAM internal word identified by the address stored in the DRAM address field DRA; a one-bit field M (data modified field) used as a flag to signal that the data contained in the associated cache internal word CIW1–CIWn have been modified in consequence of one or more write accesses to the memory 101 (as will better explained later on, this field allows to delay the write-back operation of the data stored in a SRAM cache internal word to the corresponding DRAM internal word until the cache internal word needs to be used for storing a DRAM internal word of different address); a one-bit field LRU (least recently used field) used as a flag to indicate that the cache internal word has not been accessed recently, by keeping track of the time elapsed from the last access request to the DRAM internal word identified by the address stored in the DRAM address field DRA (this can be achieved for example using a DRAM cell not subject to refresh; the leakages inherent to such a DRAM cell cause a logic one written into the memory cell to become a logic zero after a relatively well known time has elapsed); a 15-bit field CA (cache address field) for storing the address of the cache internal word associated with the DRAM address stored in the DRAM address field DRA; and a one-bit field (matching indicator field) XOR# used as a flag to signal the matching of the current external address carried by the external address bits EA[23:3] with the address stored in the DRAM address field DRA (if the address transcode table entry is a valid entry).

In the example depicted in FIG. 2, the first three address transcode table entries ATT1–ATT2 store respective DRAM addresses DRA1–DRA3 and respective cache addresses CA1–CA3, identifying the cache internal words CIW1–CIW3; the valid entry field V is set to a logic one in the three entries ATT1–ATT2, to indicate the consistency of the data stored in the associated cache internal words CIW1–CIW3 with the data stored in the DRAM locations identified by the DRAM addresses DRA1–DRA3; the data modified field M of the address transcode table entry ATT2 is set to a logic one, to indicate that the data stored in the associated cache internal word CIW3 differs from the data stored in the associated DRAM location identified by the DRAM address DRA3; in the entries ATT1 and ATT2 the least recently used field LRU is set to a logic zero, to indicate that a prescribed time has lapsed from the last access to the DRAM locations identified by the DRAM addresses DRA1 and DRA3. An X in the fields of the address transcode table depicted in FIG. 2 indicates that the corresponding address transcode table entries are still not used.

Figure 4:
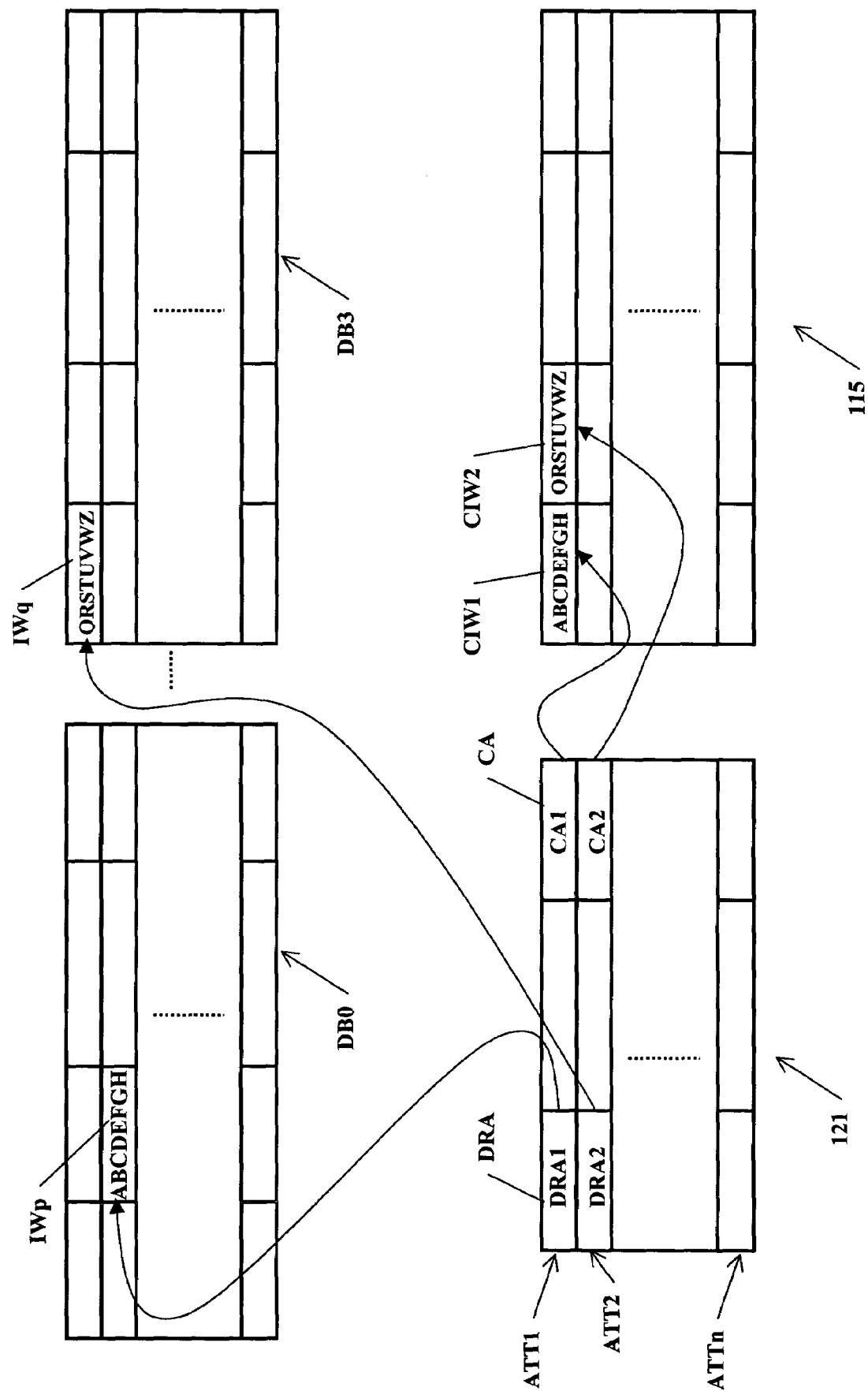
FIG. 4 schematically shows a caching scheme implemented in the memory of FIG. 1 according to an embodiment of the invention.

According to an embodiment of the present invention, a free-mapping scheme is implemented between the DRAM banks DB0–DB31 and the SRAM cache 115: any SRAM cache internal word CIW1–CIWn can be used to store the content of any DRAM internal word, according to an address transcoding handled by the address transcode table 121. In particular, there is no rigid correspondence between the rows and row sections of the SRAM cache 115 and the rows and row sections of the DRAM banks DB0–DB31. For example, as depicted in FIG. 4, the content ABCDEFGH of the internal word, identified by the DRAM address DRA1, belonging to the second row, second section of the first DRAM bank DB0 can be stored in the first cache internal word CIW1, and the content QRSTUVWZ of the internal word, identified by the DRAM address DRA2, belonging to the first row, first row section of the fourth DRAM bank DB3 can be stored in the second cache internal word CIW2.

It is to be observed that the dimension of the fields of the address transcode table entries ATT1–ATTn may vary with respect to the example described above; in particular, the dimension of the DRAM address field DRA and the cache address field CA depends on the storage capacity and number of the DRAM banks, and on the size of the SRAM cache, respectively.

According to a preferred embodiment of the invention, the address transcode table 121 is capable of simultaneously comparing the current external address EA[23:3] with all the DRAM addresses DRA1–DRA3 stored in the DRAM address field DRA of all the address transcode table entries ATT1–ATTn. In other words, the address transcode table 121 searches in parallel all the entries ATT1–ATTn to ascertain whether the current external address EA[23:3] is present in the DRAM address field DRA of an entry ATT1–ATTn of the address transcode table 121.

According to an embodiment of the present invention, such a parallel search is made possible by including a content-addressable memory (CAM) in the address transcode table 121. A CAM is a memory that is accessed supplying a data word, instead of a memory location address. The supplied data word (comparand) is simultaneously compared to all the data words stored in the CAM. If a data word in the CAM is found that matches the comparand data word, this situation is signalled by asserting a matching flag, e.g. a signal line, associated with the CAM location where the matching data word is found. The comparison between the comparand data word and a generic CAM data word involves a logic XNOR operation. Thus, the matching indicator field XOR# in the entries ATT1–ATTn need not be physically present, being simply the result of the XNOR operation performed by the CAM on the external address bits EA[23:3] and the address bits stored in the DRAM address field DRA.

Figure 3A:
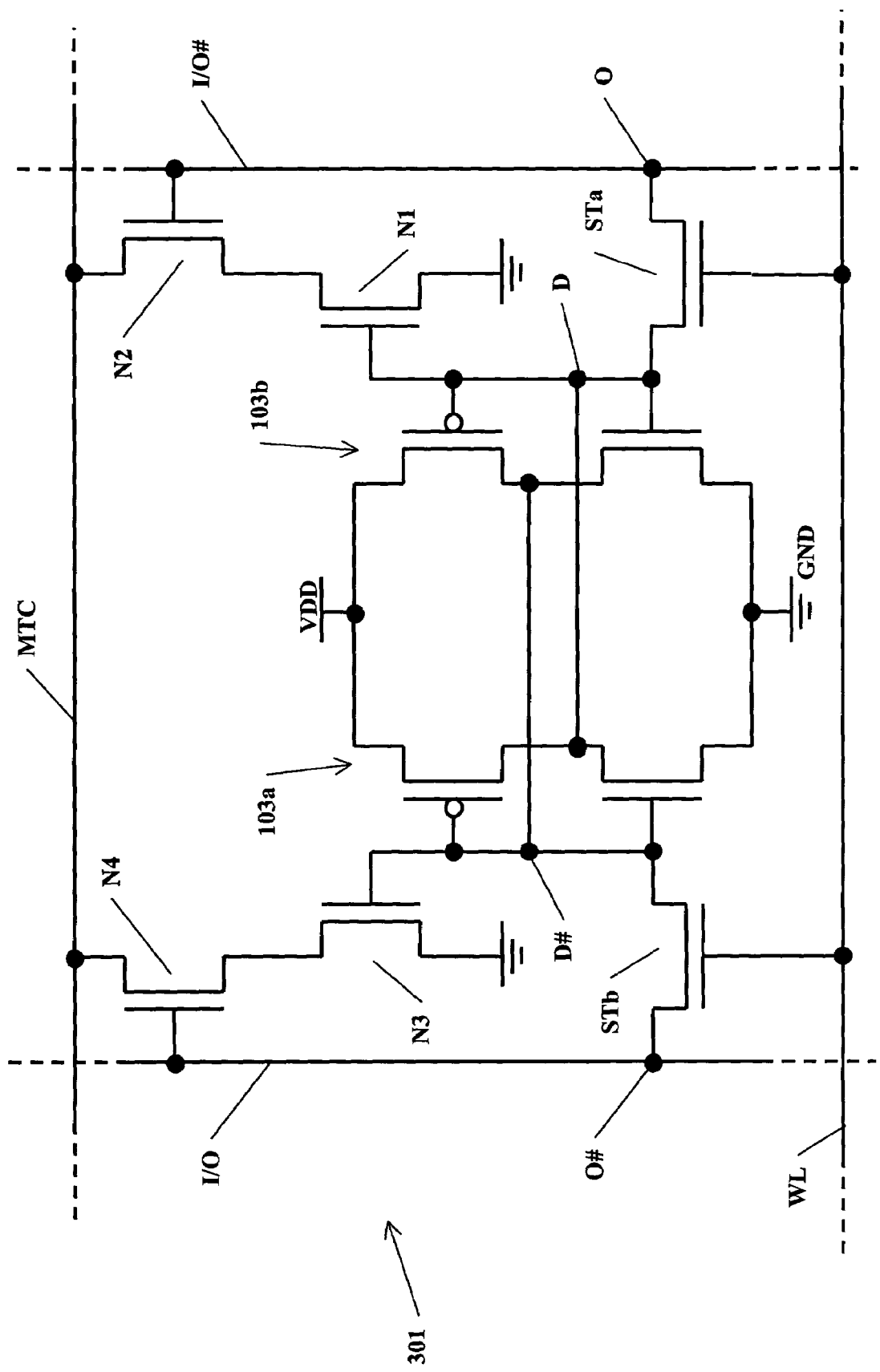
FIG. 3A shows a content-addressable memory cell of the address transcode table of FIG. 2, in an embodiment of the present invention.

FIG. 3A shows a CAM cell according to an embodiment of the present invention. The CAM cell, globally identified by 301, comprises a first and a second CMOS inverters 103a, 103b cross-connected in a latch configuration: an output of the first inverter 103a and an input of the second inverter 103b are connected to a same, first circuit node D; an input of the first inverter 103a and an output of the second inverter 103b are connected to a same, second circuit node D#. The first and second inverters 103a, 103b are connected between a supply voltage rail VDD and a reference voltage rail (ground) GND.

The first circuit node D is selectively connectable, through a first selection transistor STa, to a first CAM cell input/output node O; the second circuit node D# is selectively connectable, through a second selection transistor STb, to a second CAM cell input/output node O#. The first and second selection transistors STa, STb are for example N-channel MOSFETs with respective gates connected to a CAM cell selection signal line WL. The first and second CAM cell input/output nodes O and O# are connected to respective input/output signal lines I/O and I/O#.

The two inverters 103a, 103b and the two selection transistors STa, STb form a per-se conventional six-transistor SRAM cell. Four additional transistors N1–N4 (e.g., N-channel MOSFETs) are provided in the CAM cell. The four transistors N1–N4 comprise two pairs of transistors N1 and N2, N3 and N4 connected in series between a match indicator signal line MTC and the reference voltage GND. The transistors N1 and N2 are respectively controlled by the signals present on the circuit node D and the input/output signal line I/O#. The transistors N3 and N4 are respectively controlled by the signals present on the circuit node D# and the input/output signal line I/O.

The CAM cell selection signal WL is asserted high for reading/writing a datum from/into the CAM cell. In reading, the read datum appears on the input/output signal lines I/O and I/O#. In writing, the datum to be written is put on the input/output signal lines I/O and I/O#. The CAM cell 301 is also content-accessible: by placing on the input/output signal lines I/O and I/O# the datum (comparand) to be compared with the datum stored in the CAM cell, the match indicator signal line MTC is brought low unless coincidence is detected. For example, let it be assumed that the CAM cell 301 stores a logic one (circuit node D is high, circuit node D# is low): by placing on the input/output signal line I/O a logic one, the match indicator signal line MTC is not brought low (the transistor N3 is off, and the transistor N2 is off); if instead the datum on the input/output signal line I/O is a logic zero, the transistors N1 and N2 are both on, and the match indicator signal line MTC is brought low.

The CAM cell 301 can be used to build an array of CAM cells, in which the CAM cells are arranged by rows and columns. CAM cells on a same CAM array row share a common CAM-cell selection-signal line WL, which thus form a CAM-array word line, and a same match indicator signal line MTC; CAM cells belonging to a same CAM array column share the input/output signal lines I/O and I/O#, which thus form a pair of complementary bit lines of the CAM array.

Figure 3B:
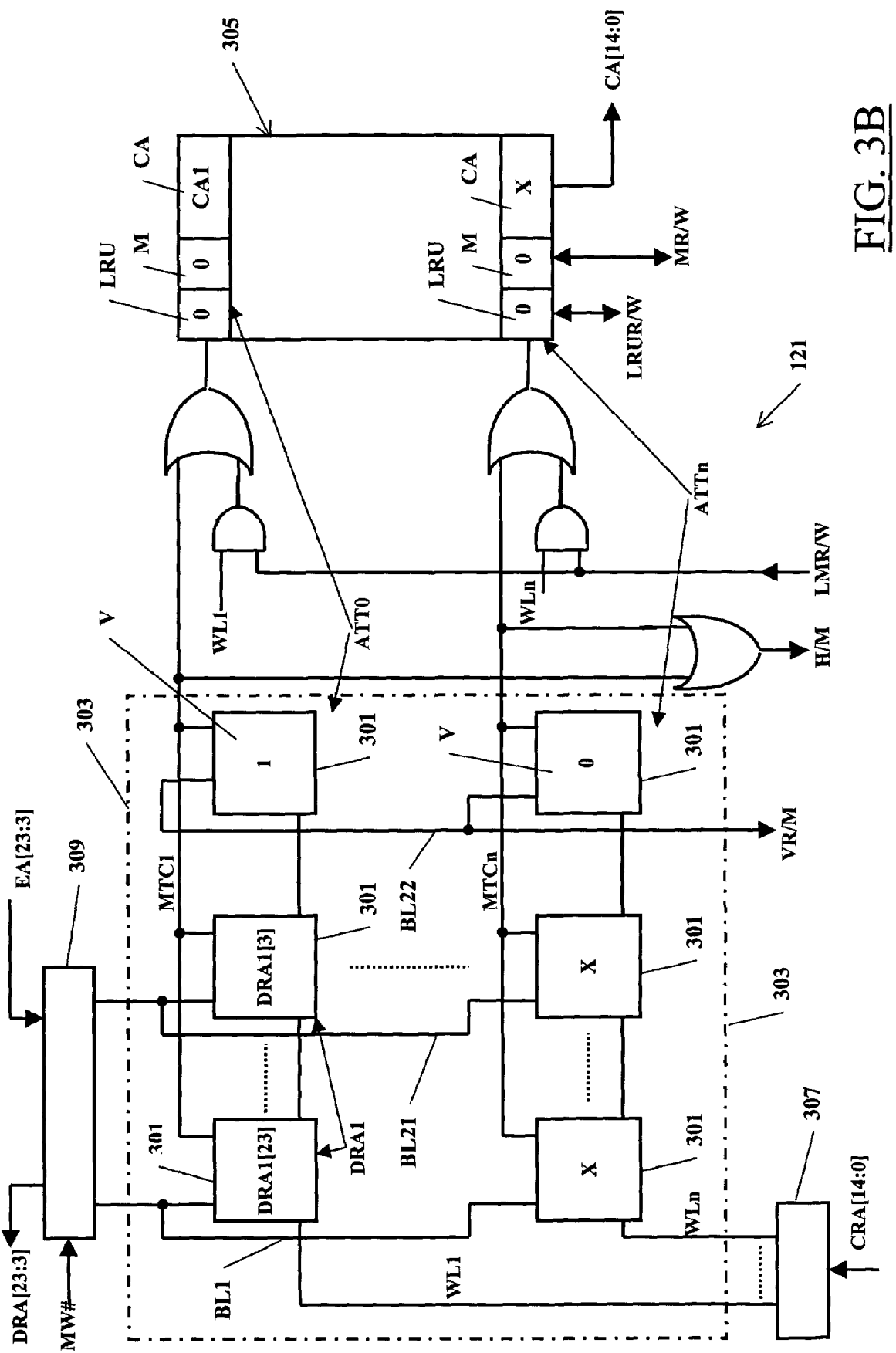
FIG. 3B schematically shows in greater detail the structure of the address transcode table of FIG. 2 according to an embodiment of the invention.

FIG. 3B schematically shows the structure of the address transcode table 121 in greater detail than in FIG. 2 according to an embodiment of the invention. The address transcode table 121 comprises a CAM portion, identified globally by 303, formed by an array of CAM cells 301, and a non-CAM portion 305. The CAM array 303 has as many rows as the number of entries ATT1–ATTn of the address transcode table 121. Each row of the CAM array 303 includes at least as many CAM cells 301 as the number of bits of the DRAM address field DRA of the address transcode table entries ATT1–ATTn, plus the number of bits of the valid entry field V. In the herein described example, each CAM array row comprises twenty-two CAM cells 301, storing the 21-bit DRAM address and the valid entry bit.

The word lines WL1–WLn of the CAM array are controlled by a CAM word-line selector 307, selecting the CAM word lines according to a CAM row address CRA[14:0] provided by the cache control sequencer 123. The twenty-one bit lines BL1–BL21 of CAM cells making up the DRAM address field DRA of the address transcode table entries ATT1–ATTn are each connected to a circuit block 309 (intended to include sense and program circuits) allowing the bit lines BL1–BL21 to be connected to the external address line EA[23]–EA[3], or to sense the data stored in the CAM cells of the selected CAM word line WL1–WLn and provide the sensed data on twenty-one address lines DRA[23:3] to be used for selecting a DRAM location during a write-back operation, as will be better explained later on. The bit line BL22 of CAM cells making up the valid entry field V forms a valid entry field read/modify signal line VR/M provided to the cache control sequencer 123. The cache control sequencer 123 provides to the address transcode table 121 a CAM row address CRA[14:0] for selecting the word line WL1–WLn in which a current external address EA[23:3] is to be written, for reading out a stored DRAM address to be placed on the address lines DRA[23:3] and for reading/changing the status of the valid entry bit V.

The CAM array 303 comprises match indicator signal lines MTC1–MTCn, each one associated with a respective row of the CAM array 303. A given match indicator signal line MTC1–MTCn is asserted high when a matching occurs between a current external address EA[23:3] and the DRAM address stored in the CAM cells 301 of the respective CAM array row, and the status of the valid entry field V coincides with a status placed by the cache control sequencer 123 on the valid entry field read/modify signal line VR/M.

The non-CAM portion 305 of the address transcode table 121 comprises an array of RAM cells, with as many rows as the entries ATT0–ATTn of the address transcode table 121. In particular, each row of the non-CAM portion 305 includes a DRAM cell, forming the one-bit least recently used field LRU of the address transcode table entry, and a number of SRAM cells sufficient for storing an SRAM cache address, plus one SRAM cell forming the one-bit data modified field M. Each row of the non-CAM portion 305 is associated with a respective row of the CAM array 303, particularly with a respective match indicator signal line MTC1–MTCn. A given row of the non-CAM portion 305 is selected when the respective match indicator signal line MTC1–MTCn is asserted high. The selection of a row of the non-CAM portion 305 causes the cache address CA[14:0] stored in the respective SRAM cells forming the cache address field CA to be provided to the SRAM cache 115. Additionally, a given row of the non-CAM portion 305 is selected when the respective row of the CAM array 303 is selected (i.e., when the respective word line WL1–WLn is selected by a cam row address CRA[14:0] provided by the cache control sequencer 123) and the cache control sequencer 123 asserts high a control signal LMR/W. This latter way of selecting a row of the non-CAM portion 305 allows the cache control sequencer 123 reading/modifying the status of the least recently used field LRU and the data modified field M, over respective signal lines LRUR/W, MR/W.

For the sake of drawing simplicity, in FIG. 1 the signals CRA[14:0], VR/M, LMR/W, LRUR/W and MR/W are globally identified by ATTR/W.

In an alternative embodiment, the valid entry field V may be implemented by means of an SRAM cell, instead of a CAM cell, and logic means (e.g., an AND gate) may be provided for conditioning the selection of a word line of the non-CAM portion of the address transcode table 121 to the set state of the correspondent valid entry field V.

It is pointed out that nothing prevents that the portion 305 of the address transcode table 121 be formed of CAM cells, albeit this is not strictly necessary for enabling the address transcode table carry out the parallel search of a DRAM address.

Referring back to FIG. 1, the cache read buffer 117 and the cache write buffer 119 are coupled to the SRAM cache 115. The cache read buffer 117 and the cache write buffer 119 enable the SRAM cache 115 to perform a read operation and a write operation during the same cycle of the clock signal CLK. Alternatively, the SRAM cache 115 is fabricated using dual-port SRAM cells, which can be used to support read and write operations during a single cycle of the clock signal CLK. The unidirectional internal data bus DA[255:0] couples the cache read buffer 117 to the write buffer 105. The data bus DA[255:0] carries the data read from cache read buffer 117 to the write buffer 105. The unidirectional internal data bus DB[255:0] couples the cache write buffer 119 to the read buffer 103 (through the multiplexer 131). The data bus DB[255:0] carries the read data from the read buffer 103 to the cache write buffer 119 (through the multiplexer 131).

During normal operations, an entire cache internal word (256 bits) can be transferred from the read buffer 103 to the SRAM cache 115 in one cycle of the clock signal CLK. Similarly, an entire cache internal word can be transferred from the SRAM cache 115 to the write buffer 105 in one cycle of the clock signal CLK. The operations of the SRAM cache 115 are controlled by the cache control sequencer 123, which relies on the address transcode table 121.

The caching policy is the following. When the memory 101 is powered up, the address transcode table 121 is reset by resetting to a logic zero the valid entry field V in every address transcode table entry ATT1–ATTn. This operation is for example entrusted to an on-chip power-on reset circuit (not shown), detecting the device powering up and thereby asserting an address transcode table clear signal CL. Then, whenever the content of a DRAM internal word is copied into a SRAM cache internal word, the valid entry field V in the associated address transcode table entry is set to a logic one. Additionally, the least recently used field LRU in that address transcode table entry is set to a logic one.

A write-back policy is employed in this embodiment of the invention. This is because a write-through policy, while simpler, would require that data be written into the DRAM banks DB0–DB31 for every write transaction. This could cause a refresh problem: if one of the DRAM banks DB0–DB31 is written continuously for a period of time longer than the maximum allowed refresh period, the bank will not be refreshed properly, and loss of data may occur.

The operation of the memory 101 will now be described for the four possible read and write transactions of read hit, write hit, read miss and write miss.

In general, when an external device, e,g. a microprocessor, needs to access the memory 101, an external address EA[23:0] is supplied to the address buffer 109. The address buffer 109 routes the external address bits EA[23:19] (bank address bits) to the bank address decoder 111; the bank address decoder 111 decodes the bank address bits EA[23:19] and starts enabling the addressed DRAM bank DB0–DB31. The address buffer 109 also routes the address bits EA[18:3] to the access control circuits AC0–AC31, through the multiplexer 136. In this way, the addressed internal word in the addressed DRAM bank is identified. Moreover, the address buffer 109 routes the address bits EA[2:0] to the multiplexer 127, for selecting the desired external word within the identified internal word.

In parallel to this, the address buffer 109 routes the external address signals EA[23:3] to the address transcode table 121.

The address transcode table 121 performs a parallel search of the address received on the external address signals EA[23:3] in the field DRA of every address transcode table entry ATT1–ATTn, to ascertain whether the accessed DRAM internal word is already in the SRAM cache 115. To this purpose, the cache control sequencer 123 places on the signal line VR/M (FIG. 3B) a logic one, thereby allowing a matching to be declared only if the valid entry field V is set.

Read Hit

If the address present on the external address signals EA[23:3] is found in the address transcode table 121, then the SRAM cache 115 contains the desired data.

The address transcode table asserts a hit/miss control signal H/M. The hit/miss control signal H/M is for example obtained by logically ORing all the matching indicator signal lines MTC1–MTCn (FIG. 3B). The hit/miss control signal H/M is provided to the bank address decoder 111, the cache control sequencer 123 and the multiplexer 129. The assertion of the hit/miss control signal H/M causes the bank address decoder 111 to release the addressed DRAM bank. The cache control sequencer 123, on the basis of the logic state of the signals ADS#, WR# and H/M, determines the type of access (read hit, read miss, write hit, write miss).

Referring back to FIG. 2, let it be assumed that the current external address EA[23:3] be equal to DRA1: such a DRAM address is stored in the first address transcode table entry ATT1, whose entry valid field V is set to a logic one. The CAM 303 incorporated in the address transcode table 121 signals the address matching by asserting high the matching indicator signal line MTC1. Consequently, the hit/miss control signal H/M is asserted.

The cache control sequencer 123 updates the least recently used field LRU in the address transcode table entry ATT1; the LRU DRAM cell is set to a logic one. The cache address CA1 stored in the field CA of the address transcode table entry ATT1 is supplied to the SRAM cache 115. By de-asserting a cache write/read indicator signal CWR#, the cache control sequencer 123 then causes the SRAM cache 115 to access the cache internal word CIW1 identified by the cache address CA1. The content of the accessed cache internal word CIW1 is provided to the cache read buffer 117. The desired data are routed from the cache read buffer 117 to the multiplexer 129 over the internal data lines DA[255:0]. The multiplexer 129 routes this data to the multiplexer 127 in response to the asserted hit/miss control signal H/M. The multiplexer 127 routes the selected external word within the eight 32-bit words of the cache internal word to the I/O driver 125 in response to the byte select address bits EA[2:0]. The I/O driver 125 provides the selected word on the data bus DQ[31:0].

It is to be observed that the DRAM banks DB0–DB31 are not accessed during a read hit access, because the requested data are already stored in the SRAM cache 115. Thanks to this, all of the DRAM banks DB0–DB31 are able to perform refresh operations during a read hit access.

Write Hit

In general, a write access differs from a read access for the fact that the read/write indicator signal WR# is asserted.

A write access is a write hit access if the content of the addressed DRAM internal word is already stored in the SRAM cache 115. Let it be again assumed that the external address EA[23:3] is equal to DRA1. As in the previously discussed read hit case, the address transcode table 121 asserts the matching indicator signal MTC1 and thus the hit/miss control signal H/M. The cache address CA1, identifying the cache internal word CIW1, is supplied to the SRAM cache 115 by the address transcode table 121. The cache control sequencer 123, recognizing that the present access is a write hit access by the state of signals WR# and H/M, asserts the cache read/write indicator signal CWR#, thereby causing the external write data to be written directly into the cache internal word CIW1, rather than into the addressed DRAM location. The 32-bit external word to be written is provided to the I/O driver 125 on the data bus DQ[31:0]. The I/O driver 125 routes the external word to be written to de-multiplexer 133. In response to the byte address EA[2:0], the de-multiplexer routes the external word to be written onto a set of bus lines corresponding to the appropriate external word position within the internal word. The external word is routed through the multiplexer 131, in response to an external write enable signal EWR asserted by the cache control sequencer 123, to the cache write buffer 119. The cache write buffer 119 provides the external word to overwrite the corresponding word stored in the SRAM cache internal word CIW1. The cache control sequencer 123 also causes the data modified indicator field M and the least recently used field LRU in the corresponding address transcode table entry ATT1 to be set to logic ones.

As in the read hit access case, the DRAM banks DB0–DB31 are not accessed during a write hit access. All of the DRAM banks DB0–DB31 can thus be refreshed during a write hit access.

Read Miss

If the address carried by the external address bits EA[23:3] is not found in the address transcode table 121, the desired data are not present in the SRAM cache 115. The hit/miss control signal H/M is not asserted, because no matching addresses are found in the field DRA of the address transcode table entries ATT1–ATTn. This enables the bank address decoder 111 to select the addressed DRAM bank DB0–DB31. The desired data are retrieved from the addressed DRAM bank DB0–DB31 and routed through the multiplexer 129 in response to the de-asserted hit/miss signal H/M. The multiplexer 127 routes a selected one of the eight external words making up the retrieved internal word to the I/O driver 125 (and thereby to data bus DQ[31:0]) in response to the byte select address bits EA[2:0].

Additionally, the content of the internal word retrieved from the DRAM bank is copied into the SRAM cache 115 for future accesses. The cache control sequencer 123 starts a cache allocation procedure.

Firstly, the address transcode table 121 is searched through to ascertain whether there is a free entry (a free entry in the address transcode table 121 corresponding to a free location in the SRAM cache 115). The presence of free entries in the address transcode table 121 is detected by controlling the logic state of the valid entry field V in all the address transcode table entries ATT1–ATTn.

When an address transcode table entry is found having the entry valid field V in the zero logic state (e.g., entry ATT3 in FIG. 2), the address transcode table entry is recognized by the cache control sequencer 123 as free and available. The external address carried by the external address signals EA[23:3] is written into the DRAM address field DRA of the selected address transcode table entry, and the address of the SRAM cache location in which the desired data will be copied into is written into the cache address field CA of the selected address transcode table entry. The valid entry field V and the least recently used field LRU of the selected address transcode table entry are then set to logic ones.

Under the control of the cache control sequencer 123, the cache internal word identified by the address stored in the cache address field CA of the address transcode table entry selected for the new allocation (supplied to the SRAM cache 115 by the address transcode table 121) is accessed in writing (the cache read/write indicator signal CWR# is asserted high). The content of the internal word retrieved from the accessed DRAM location is routed through the read buffer 103, the multiplexer 131 and the cache write buffer 119, and is written into the accessed cache internal word.

If no free entries are found in the address transcode table 121 (i.e., all the address transcode table entries ATT1–ATTn have the respective entry valid field V set to a logic one), the least recently used field LRU of every address transcode table entry ATT1–ATTn is checked. Address transcode table entries having the least recently used field LRU set to a logic zero correspond to cache internal words which have not been accessed recently; not recently access means that a cache internal word has not been accessed for a time longer than a prescribed time (e.g., the time taken by a DRAM cell to switch from a logic one to a logic zero state due to leakages inherent to the respective storage capacitor). The first address transcode table entry encountered that has the respective least recently used field LRU set to a logic zero is selected for the new data allocation.

Before copying the content of the internal word retrieved from the accessed DRAM bank into the cache internal word corresponding to the selected address transcode table entry, the data modified field M of the selected address transcode table entry is checked by the cache control sequencer 123.

If the data modified field M is found set to a logic one, the cache control sequencer 123 causes the data stored in the cache internal word identified by the address stored in the cache address field CA of the selected address transcode table entry to be written back into the DRAM location identified by the address stored in the DRAM address field DRA of the same address transcode table entry. This write-back operation is only required if the field M has been set, meaning that the content of the associated SRAM cache internal word has been modified since when the DRAM internal word data was copied there into. The cache control sequencer 123 asserts low a memory write control signal MW#. The memory write control signal causes the DRAM address stored in the DRAM address field DRA of the address transcode table entry to be read and put on the address signal lines DRA[23:3] (FIG. 3B). The memory write control signal MW# also causes the multiplexer 136 to put on the internal address lines IA[18:3] the address carried by on the address lines DRA[18:3] retrieved from the address transcode table 121. The bank address present on the address lines DRA[23:19] is provided to the bank address decoder 113, which is enabled to select for writing the addressed DRAM bank by the memory write signal MW#. The DRAM location identified by the address present on the address lines DRA[23:3] is thus selected for writing, and the data stored in the corresponding cache internal word written back into the correct DRAM location. The write-back operation consists of the cache internal word being retrieved and being routed to the corresponding DRAM location through the cache read buffer 117 and the write buffer 105.

If the field M is not set to a logic one, meaning that the content of the associated cache internal word still coincide with that of the corresponding DRAM internal word, then no write-back is required.

It is underlined that during a read miss access, all of the DRAM banks other than the DRAM banks (possibly one, at most two) involved in the read or write-back operations can be refreshed.

Write Miss

If the current access is a write miss access, then the content of the addressed DRAM location is not present in the SRAM cache 115. A cache miss is detected, and the hit/miss control signal H/M is kept de-asserted.

The addressed internal word is retrieved from the addressed DRAM bank DB0–DB31 and provided to the read buffer 103. The data in the read buffer 103 is routed, together with the external word to be written (available at the output of the de-multiplexer 133), to the multiplexer 131. The multiplexer 131 combines the 256-bit internal word coming from the read buffer 103 with the 32-bit external word to be written. The resulting 256-bit word is written into the SRAM cache 115, following the same allocation procedure previously described in connection with the read miss case. The data modified field M of the address transcode table entry associated with the cache internal word into which the internal word is written is set to a logic one, thereby indicating a discrepancy between the data contained in the SRAM cache 115 and the data contained in the corresponding DRAM location.

The DRAM banks other that that accessed are thus left free to carry on the refresh operation on the respective DRAM cells.

From the above description, it can be appreciated that the DRAM banks are not accessed when a cache hit occurs. Refresh operations can therefore be performed within the DRAM banks when a cache hit occurs, when a refresh request is pending. Because the DRAM banks are independently controlled, all of the DRAM banks can be simultaneously refreshed during a cache hit. Alternatively, predetermined sets of the DRAM banks can be simultaneously refreshed.

When a cache miss occurs, only one or, at most, two DRAM banks need to be accessed, the remaining DRAM banks being left free to carry on the refresh operation.

Figure 5:
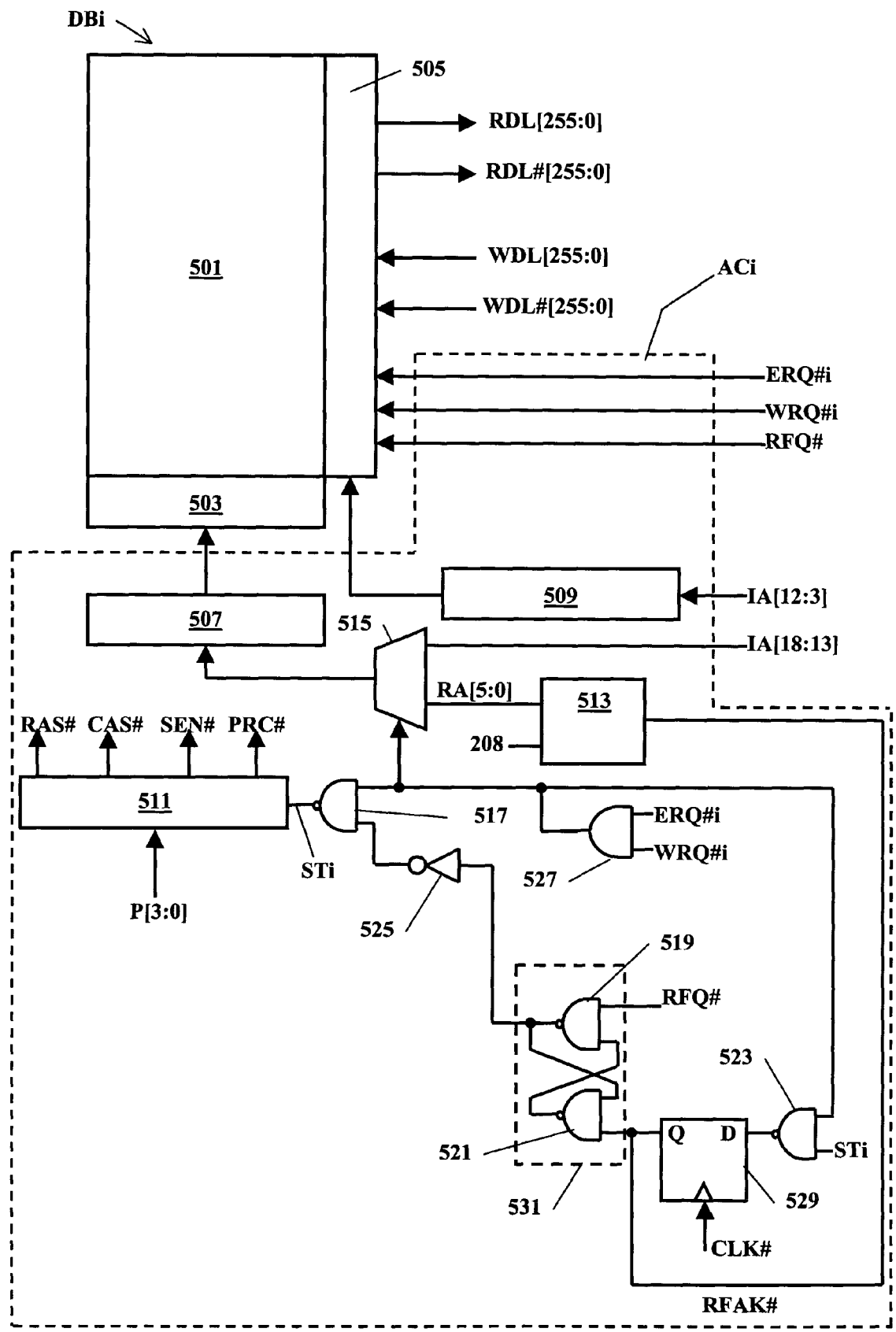
FIG. 5 is a schematic diagram of a DRAM bank and an associated access control circuit in accordance with an embodiment of the present invention.

FIG. 5 is a schematic diagram of a generic DRAM bank DBi of the plurality of DRAM banks DB0–DB31, and the respective access control circuit ACi. The DRAM bank DBi consists of a DRAM cell array 501 having 64 rows and 1024 sections of 256 columns each. The DRAM bank DBi further includes all the conventional circuits associated with a DRAM cell array, such as word line drivers 503, and sense amplifiers and column multiplexers 505. Data buses RDL [255:0] and RDL#[255:0] couple the DRAM bank DBi to the read buffer 103. Data buses WDL[255:0] and WDL# [255:0] couple the DRAM bank DBi to the write buffer 105. The access control circuit ACi includes a row address decoder 507, a column address decoder 509, a memory bank control sequencer 511, a refresh address counter 513, an address multiplexer 515, and an access arbitration circuit for regulating the external accesses and the refresh accesses. The access arbitration circuit includes NAND logic gates 517–523, an inverter 525, an AND logic gate 527 and a flip-flop 529.

The memory bank control sequencer 511 generates access control signals RAS# (row access strobe), CAS# (column access strobe), SEN# (sense amplifier enable) and PRC# (pre-charge) for controlling the operations of the DRAM bank DBi. The RAS#, CAS#, SEN# and PRC# signals are generated at predetermined times within a single cycle of the clock signal CLK, wherein the predetermined times are determined with respect to the rising and falling edges of the clock signal CLK. As a result, the DRAM bank DBi completes a memory cycle in one cycle of the clock signal CLK. The timing of the control signals RAS#, CAS#, SEN# and PRC# is controlled by the four phase clock signals P[3:0] generated by the clock phase generator 107 (FIG. 1). The clock phase generator 107 generates the phase clock signals P[3:0] in response to the clock signal CLK using a delay line scheme. Since a memory cycle takes only one clock period, the DRAM bank DBi can process one random access or one row refresh during one clock cycle.

A memory cycle is initiated when the NAND gate 517 asserts high a signal STi to the memory bank control sequencer 511. The signal STi is driven high when any of the three following signals is asserted low: read request signal ERQ#i, write request signal WRQ#i, or refresh request signal RFQ#. The read request signal ERQ#i is one of thirty-two read request signals ERQ#[0:31], generated by the bank address decoder 111 for selecting the DRAM banks DB0–DB31 in read. The write request signal WRQ#i is one of thirty-two write request signals WRQ#[0:31], generated by bank address decoder 113 for selecting the DRAM banks DB0–DB31 in write. The refresh request signal RFQ# is generated by the refresh timer 135. Each one of the DRAM banks DB0–DB31, having respective read request signals and write request signals, is independently controlled.

The read request signal ERQ#i is generated by the bank address decoder 111 (FIG. 1). The read request signal ERQ#i is asserted low when a cache miss occurs and data must be read from the DRAM bank DBi as a result of the cache miss. The conditions under which such a read access may be required have been described above in connection with the write miss and read miss accesses.

The write request signal WRQ#i is asserted low when a cache miss occurs and data stored in SRAM cache 115 must be written back to the DRAM bank DBi. The conditions under which a write-back operation is required have been described above in connection with the read miss and write miss accesses.

Either the write request signal WRQ#i or the read request signal ERQ#i can be asserted low at the time that the refresh request signal RFQ# is asserted low to initiate a refresh access. As described below, both the write request signal WRQ#i and the read request signal ERQ#i always have priority over the refresh request signal RFQ#. As a result, accesses to the DRAM bank DBi are never delayed by refresh accesses.

The refresh timer 135 (FIG. 1) can be implemented by means of a binary counter. The size of the binary counter and the memory operating frequency determines the period of the refresh requests. Each of the memory banks DB0–DB31 is refreshed independently, with one row of a memory bank being refreshed during one refresh cycle. A refresh access is implemented by reading a row of a DRAM bank. Reading a row of a DRAM bank has the effect of refreshing the charge in the DRAM cells in the row. Sixty-four refresh cycles are required to completely refresh all 64 rows of a DRAM bank. The output of the refresh timer 135 provides the refresh request signal RFQ#, which is activated for one clock cycle when the refresh timer 135 reaches a full count, that is, when all the counter bits are high.

However, an access collision may occur when a refresh request and an external access request (i.e., a cache miss access) are generated during the same clock cycle. The access collision is handled in the DRAM bank by processing the cache miss access first and delaying the refresh request by saving the low state of the refresh request signal RFQ# in a flip-flop 531. The flip-flop 531 is formed by the NAND gates 519 and 521 in FIG. 5. The cache miss access always takes priority over the refresh access to ensure that the external memory access is always completed without delay. As a result, the DRAM bank refresh accesses are transparent to the outside world, thereby making the memory 101 behave in a manner that is completely compatible with an SRAM device.

The access priority is set by the address multiplexer 515, which is controlled to provide either the row address IA[18:13] or the refresh row address RA[5:0] to the row address decoder 507. The row address IA[18:13] is the row address associated with a cache miss access. The address multiplexer 515 is controlled by the output signal provided by the AND gate 527. The input terminals of the AND gate 527 receives the read request signal ERQ#i and the write request signal WRQ#i. When either of these request signals is asserted low, the address multiplexer 515 selects the row address IA[18:13] for the current memory cycle. In the absence of cache miss access, both the signals ERQ#i and WFRQ#i are de-asserted high, thereby causing the multiplexer 515 to route the refresh address RA[5:0] to the row address decoder 507.

The refresh access is delayed until the DRAM bank is idle. The flip-flop 531 is set when the refresh request signal RFQ# is asserted low. The flip-flop 531 remains in the set state until a refresh acknowledge signal RFAK# is asserted low. The refresh acknowledge signal RFAK# is asserted low when the signals STi, ERQ#i and WRQ#i are high. When all these signals are high, a refresh access is initiated. The flip-flop 529 synchronizes the resetting of the flip-flop 531 with the clock signal CLK. The six-bit refresh address counter 513 keeps track of the row address to be refreshed. The refresh address counter 513 is incremented upon every low to high transition of the refresh acknowledge signal RFAK#. After the refresh address counter 513 reaches the full count (111111), it resets to 000000.

In the foregoing, a logical mapping between the address transcode table 121 and the SRAM cache 115 has been described providing for storing, in every address transcode table entry ATT1–ATTn, the address of the associated cache internal word CIW1–CIWn. In particular, the cache address is stored in the cache address field CA of the address transcode table entry ATT1–ATTn made up of a suitable number of SRAM cells. This requires that the cache addresses be written into the cache address field CA of the address transcode table entries ATT1–ATTn. For example, the cache addresses are written into the cache address field CA of the address transcode table entries ATT1–ATTn at the memory power-up. Alternatively, the cache address is written into the cache address field CA of an address transcode table entry during the cache allocation procedure, under the control of the cache control sequencer 123; for example, the cache control sequencer 123 may include a counter, the content of which is copied into the cache address field CA of an address transcode table entry the first time a new cache location is allocated, and is then incremented, or decremented, to contain the next cache address for a successive new allocation.

Other embodiments of logical mapping between the address transcode table 121 and the SRAM cache 115 are possible. In a first alternative embodiment, the cache address field CA of the address transcode table entries ATT1–ATTn can be made up of non-volatile memory cells, e.g. ROM cells, and the cache addresses be permanently written in the address transcode table entries ATT1–ATTn. In this way, the physical dimensions of the address transcode table are reduced (a non-volatile memory cell is smaller than an SRAM memory cell), and the cache allocation procedure is made faster, since only the DRAM address needs to be written into the DRAM address field DRA of an address transcode table entry ATT1–ATTn. A second alternative embodiment exploits the coincidence between the number of address transcode table entries and the number of SRAM cache internal words. A one-to-one correspondence between the address transcode table entries and the cache internal words exists. This makes it unnecessary to provide a field in each address transcode table entry in which storing the cache address. During a cache hit access the address transcode table, instead of providing to the SRAM cache a cache address, directly selects a cache row and row section, thereby selecting the desired cache internal word. The SRAM cache needs not be provided with row and column decoder and selection circuits 201 and 203, with a significant reduction of circuitry and semiconductor area.

Thanks to embodiments of the present invention, the choice of the SRAM cache storage capacity can be done solely on the basis of a trade off between the desire of keeping the semiconductor area overhead limited and the need of ensuring that all refresh accesses of the DRAM banks are properly performed within a predetermined refresh period, even under the worst case cache thrashing conditions. The flexible mapping scheme between the SRAM cache and the DRAM banks, allowed by the address transcode table, does not pose constraints on the size of the SRAM cache; in particular, the size of the SRAM cache needs not be correlated to the size of the DRAM banks.

The provision of an address transcode table capable of performing a parallel search through all the entries thereof of a current external address, makes it possible to detect a cache hit in a single step.

The flexibility of the cache mapping allows exploiting more efficiently the SRAM cache storage capacity. As far as free cache locations are available, newly accessed DRAM locations can be stored in the SRAM cache without the need of substituting an already allocated cache location. Cache data substitution is only needed when the SRAM cache is full.

Another advantage of the flexible mapping scheme is the possibility of implementing intelligent cache allocation algorithm. For example, a sequence of data accessed in succession can be kept in the SRAM cache, whichever the DRAM bank and the position within the bank of each data of the sequence.

The provision of an indication of how recently a cache location has been accessed also allows making the cache allocation and substitution procedure more efficient. When the cache is full, the cache location to be used is not chosen randomly, but according to a criterion that reduces the number of swaps between the DRAM banks and the SRAM cache. Statistically, it makes much more sense discarding a cache location not recently accessed than a cache location accessed recently.

Although the invention has been described in connection with several embodiments, it is understood that this invention is not limited to the embodiments disclosed, but is susceptible of various modifications that would be apparent to a person skilled in the art. For example, the DRAM banks and the SRAM cache memory can have different sizes in different embodiments. Similarly, a different number of DRAM banks can be provided. Moreover, buses having different widths than those described can be used in other embodiments. In addition, refresh request signals having different timing relationships can be provided to different groups of DRAM banks. For example, a first refresh request signal may be provided to control the refresh a first set of DRAM banks, and a second refresh signal may be provided to control the refresh of a second set of DRAM banks. The second refresh signal can be asserted one clock cycle later than the first refresh signal, such that the DRAM banks in the first and second sets are not refreshed simultaneously. Refreshing the DRAM banks of the first and second sets at different (staggered) times can help to avoid electrical noise problems that may be present if all of the DRAM banks are refreshed at the same time. In other embodiments, more than two staggered refresh request signals can be used.

Other modifications can be envisaged, without departing from the scope of the invention defined in the appended claims.

What is claimed is:

1. A memory, comprising:
   semiconductor material;
   memory banks disposed in the semiconductor material and each having a number of memory locations;
   a cache disposed in the semiconductor material, coupled to the memory banks, and having storage locations that are each mappable to any one of the memory locations; and
   an address table disposed in the semiconductor material, coupled to the cache, and operable to map a storage location to a memory location and to indicate a time elapsed since an access of the memory location.

2. A memory, comprising:
   memory banks each having a number of memory locations;
   a cache coupled to the memory banks and having storage locations that are each mappable to any one of the memory locations;
   an address table coupled to the cache and operable to map a storage location to a memory location and to indicate a time elapsed since an access of the memory location; and
   wherein the address table comprises a DRAM cell operable to store a state that indicates the time elapsed since the access of the memory location.

3. A system, comprising:
   a memory having,
      a semiconductor material;
      memory banks disposed in the semiconductor material and each having a number of memory locations,
      a cache disposed in the semiconductor material, coupled to the memory banks, and having storage locations that are each mappable to any one of the memory locations, and
      an address table disposed in the semiconductor material, coupled to the cache, and operable to map a storage location to a memory location and to indicate a time elapsed since an access of the memory location.

4. A memory device comprising:
   a plurality of banks of storage locations accessible in response to access requests;
   data refresh means for refreshing data stored in the storage locations within prescribed times;
   a cache memory having a plurality of cache storage locations, for storing data contained in recently accessed storage locations;
   access control means for controlling the access to the storage locations and to the cache storage locations in response to the access requests, the access control means diverting an access request to the cache memory whenever access to anyone of the recently accessed storage locations is requested;
   wherein any cache storage location is freely associable to any storage location in any bank, the association between any cache storage location and a storage location in the plurality of banks being established by a storage location association table in the access control means;
   wherein the storage location association table stores addresses identifying the recently accessed storage locations, and, each time an access request is detected, compares an access request address identifying a storage location to which access is requested with the stored addresses of the recently accessed storage locations; and
   wherein the storage location association table stores, for each one of the recently accessed storage locations, an indication of time lapsed from the last access request to the storage location.

5. The memory device according to claim 4, in which when an access request to a storage location different from the recently accessed storage locations is received, the access control means perform a cache memory allocation procedure, the cache memory allocation procedure comprising copying the data contained in the accessed storage location into the cache memory and storing the address identifying the accessed storage location in the storage location association table.

6. The memory device according to claim 5, in which the cache memory allocation procedure comprises:
if non-allocated cache storage locations exist, allocating one of the non-allocated cache storage locations, otherwise allocating a cache storage location associated to a storage location for which the indication of time lapsed from the last access request indicates a time lapse greater than a prescribed time.

7. The memory device according to claim 6, in which when the access detected by the control means is a write access request to a storage location for writing data, the data content of the cache storage location associated with the accessed storage location is modified according to the write data, instead of the data content of the accessed storage location.

8. The memory device according to claim 7, in which the storage location association table stores, for each one of the recently accessed storage locations, a data modified indication indicative of the fact that the data content of the associated cache storage location has changed due to one or more write access requests to the recently accessed storage location.

9. The memory device according to claim 8, in which the allocation procedure comprises:
when allocating a cache storage location already associated with a storage location, controlling the data modified indication in the storage location association table to check whether the data content of the cache storage location has been modified and, in the affirmative case, writing back the data content of the cache storage location into the associated storage location before allocating the cache storage location.

10. A method, comprising:
writing data to a first storage location of a physical cache, the first storage location mapped to a first memory location of a physical memory bank;
determining whether at least a predetermined time has elapsed from the writing of the data; and
remapping the first cache storage location to a second memory location of the memory bank if at least the predetermined time has elapsed from the writing of the data.

11. The method of claim 10, further comprising mapping a second cache storage location to the second memory location if the predetermined time has not elapsed from the writing of the first data.

* * * * *